United States Patent
Chan et al.

(10) Patent No.: US 11,807,944 B2
(45) Date of Patent: Nov. 7, 2023

(54) LITHIUM LANTHANUM ZIRCONATE THIN FILMS

(71) Applicants: Candace Chan, Phoenix, AZ (US); Jon Mark Weller, Phoenix, AZ (US)

(72) Inventors: Candace Chan, Phoenix, AZ (US); Jon Mark Weller, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/685,923

(22) Filed: Mar. 3, 2022

(65) Prior Publication Data

US 2022/0186380 A1 Jun. 16, 2022

Related U.S. Application Data

(62) Division of application No. 16/669,767, filed on Oct. 31, 2019, now Pat. No. 11,268,196.

(Continued)

(51) Int. Cl.
  *C23C 22/70* (2006.01)
  *C23C 16/40* (2006.01)
  (Continued)

(52) U.S. Cl.
  CPC ............ *C23C 22/70* (2013.01); *C23C 16/405* (2013.01); *C23C 16/45555* (2013.01);
  (Continued)

(58) Field of Classification Search
  None
  See application file for complete search history.

(56) References Cited

U.S. PATENT DOCUMENTS

| 8,906,551 B2 | 12/2014 | Chan et al. |
| 9,590,247 B2 | 3/2017 | Chan |

(Continued)

FOREIGN PATENT DOCUMENTS

| CN | 104332651 | 2/2015 |
| CN | 105406117 | 3/2016 |

(Continued)

OTHER PUBLICATIONS

Kazyak et al. "Atomic Layer Deposition of the Solid Electrolyte Garnet Li7La3Zr2O12". Chem. Mater. 2017, 29, 3785-3792. DOI: 10.1021/acs.chemmater.7b00944 with supporting information (Year: 2017).*

(Continued)

*Primary Examiner* — Jose I Hernandez-Kenney
(74) *Attorney, Agent, or Firm* — Fish & Richardson P.C.

(57) ABSTRACT

Forming a lithium lanthanum zirconate thin film includes disposing zirconium oxide on a substrate to yield a zirconium oxide coating, contacting the zirconium oxide coating with a solution including a lithium salt and a lanthanum salt, heating the substrate to yield a dried salt coating on the zirconium oxide coating, melting the dried salt coating to yield a molten salt mixture, reacting the molten salt mixture with the zirconium oxide coating to yield lithium lanthanum zirconate, and cooling the lithium lanthanum zirconate to yield a lithium lanthanum zirconate coating on the substrate. In some cases, the zirconium oxide coating is contacted with an aqueous molten salt mixture including a lithium salt and a lanthanum salt, the molten salt mixture is reacted with the zirconium oxide coating to yield lithium lanthanum zirconate, and the lithium lanthanum zirconate is cooled to yield a lithium lanthanum zirconate coating on the substrate.

18 Claims, 6 Drawing Sheets

Related U.S. Application Data (60) Provisional application No. 62/753,503, filed on Oct. 31, 2018.

(51) Int. Cl.

| | |
|---|---|
| *C23C 28/04* | (2006.01) |
| *C23C 16/455* | (2006.01) |
| *C23C 18/12* | (2006.01) |
| *C23C 16/56* | (2006.01) |
| *H01M 10/0562* | (2010.01) |
| *C23C 22/05* | (2006.01) |
| *H01M 10/0525* | (2010.01) |

(52) U.S. Cl.
CPC ...... *C23C 18/1216* (2013.01); *C23C 18/1295* (2013.01); *C23C 22/05* (2013.01); *C23C 28/042* (2013.01); *H01M 10/0562* (2013.01); *C23C 16/56* (2013.01); *H01M 10/0525* (2013.01); *H01M 2300/0077* (2013.01); *Y02E 60/10* (2013.01)

(56) References Cited

U.S. PATENT DOCUMENTS

| | | | |
|---|---|---|---|
| 9,853,324 | B2 | 12/2017 | Chan et al. |
| 10,128,488 | B2 | 11/2018 | Chan |
| 10,170,759 | B2 | 1/2019 | Seo et al. |
| 10,858,263 | B2 | 12/2020 | Weller et al. |
| 11,053,134 | B2 | 7/2021 | Weller et al. |
| 11,084,734 | B2 | 8/2021 | Weller et al. |
| 11,268,196 | B2 | 3/2022 | Chan et al. |
| 2010/0047696 | A1 | 2/2010 | Yoshida et al. |
| 2010/0200850 | A1* | 8/2010 | Couchaud ............. H01L 29/227 257/E21.04 |
| 2011/0053000 | A1 | 3/2011 | Kanamura et al. |
| 2012/0196189 | A1 | 8/2012 | Babic et al. |
| 2013/0344416 | A1 | 12/2013 | Sakamoto et al. |
| 2014/0072870 | A1 | 3/2014 | Otsuka et al. |
| 2014/0186720 | A1 | 7/2014 | Kintaka |
| 2015/0130115 | A1 | 5/2015 | Sung et al. |
| 2015/0180001 | A1* | 6/2015 | Johnson ............... C01G 25/006 429/246 |
| 2016/0141605 | A1 | 5/2016 | Chan et al. |
| 2016/0248118 | A1 | 8/2016 | Chan et al. |
| 2016/0293988 | A1 | 10/2016 | Sakamoto et al. |
| 2017/0155169 | A1 | 6/2017 | Hitz et al. |
| 2018/0034054 | A1 | 2/2018 | Chan et al. |
| 2018/0362360 | A1 | 12/2018 | Chan et al. |
| 2018/0375149 | A1 | 12/2018 | Beck et al. |
| 2019/0062176 | A1* | 2/2019 | Weller ................ C01G 25/006 |
| 2019/0337817 | A1 | 11/2019 | Weller et al. |
| 2021/0230013 | A1 | 7/2021 | Weller et al. |
| 2021/0371296 | A1 | 12/2021 | Weller et al. |
| 2021/0403340 | A1 | 12/2021 | Weller et al. |

FOREIGN PATENT DOCUMENTS

| | | | |
|---|---|---|---|
| CN | 105406117 A | * | 3/2016 |
| WO | WO2013158307 | | 10/2013 |
| WO | WO2013192417 | | 12/2013 |
| WO | WO2014134350 | | 9/2014 |
| WO | WO2014205381 | | 12/2014 |
| WO | WO2015006010 | | 1/2015 |
| WO | WO2015038735 | | 3/2015 |
| WO | WO2015006010 | | 7/2015 |

OTHER PUBLICATIONS

Reddy & Adams. Molten salt synthesis and characterization of fast ion conductor Li6.75La3Zr1.75 Ta0.25O12. J Solid State Electrochem (2017) 21:2921-2928. DOI 10.1007/sl0008-01 7—3615—2 (Year: 2017).*

Afyon et al. "A Shortcut to Garnet-Type Fast Li-Ion Conductors for All-Solid State Batteries". J. Mater. Chem. A 2015, 3, pp. 18636-18648.

Awaka et al. "Synthesis and Structure Analysis of Tetragonal Li7La3Zr2O12 with the Garnet-Related Type Structure". J. Solid State Chem. 2009, 182:2046-2052, https://doi.org/10.1016/j.jssc.2009.05.020.

Baek et al. "Garnet Related Lithium Ion Conductor Processed by Spark Plasma Sintering for All Solid State Batteries". J. Power Sources 2014, 249, 197-206.

Buschmann et al. "Lithium Metal Electrode Kinetics and Ionic Conductivity of the Solid Lithium Ion Conductors 'Li7La3Zr2O12' and Li7—xLa3Zr2—xTaXO12 with Garnet-Type Structure". J. Power Sources 2012, 206, 236-244.

Cassir et al., "Synthesis of $ZrO_2$ Thin Films by Atomic Layer Deposition: Growth Kinetics, Structural and Electrical Properties," Applied Surface Science, 2002, 193(1-4):120-128.

Chan et al. "Nanostructured Garnet-Type Li7La3Zr2O12 : Synthesis, Properties, and Opportunities as Electrolytes for Li-Ion Batteries". Electrochim. Acta 2017, 253, 268-280.

Chen et al., "Effect of a ZrO2 Coating on the Structure and Electrochemistry of LixCoO2 When Cycled to 4.5 V," Electrochem. Solid-State Lett., 2002, 5(10):A213, https://doi.org/10.1149/1.1503202.

Chen et al., "Towards Shape Control of Metal Oxide Nanocrystals in Confined Molten Media," Chem. Nano. Mat, 2015, 1(1):18-26, https://doi.org/10.1002/cnma.201500032.

Cheng et al. "Effect of surface microstructure on electrochemical performance of garnet solid electrolytes". ACS Appl. Mater. Interfaces 7, 2073-2081 (2015).

Cheng et al. "Interrelationships among Grain Size, Surface Composition, Air Stability, and Interfacial Resistance of Al-Substituted Li7La3Zr2O12 Solid Electrolytes". ACS Appl. Mater. Interfaces 2015, 7, 17649-17655.

Cho et al., "Zero-Strain Intercalation Cathode for Rechargeable Li-Ion Cell," Angew. Chemie—Int. Ed. 2001, 40(18):3367-3369, https://doi.org/10.1002/1521-3773.

Danks et al. "The evolution of 'sol-gel' chemistry as a technique for materials synthesis" Mater. Horizons 3, 91-112 (2016).

Daviannapoorani et al., "Synthesis of Lithium garnets from La2Zr2O7 pyrochlore," Solid State Ionics, Oct. 24, 2015, 283:123-130.

Deviannapoorani et al. "Synthesis of Garnet Structured Li7+xLa3YXZr2 XO12 (X = 0-0.4) by Modified Sol-Gel Method". J. Sol-Gel Sci. Technol. 2012, 64, 510-514.

Fang et al. "Grain growth during sintering of nanosized particles". Ceram. Trans. 209, 389-400 (2010).

Fu et al. "Flexible, solid-state, ion-conducting membrane with 3D garnet nanofiber networks for lithium batteries" PNAS, vol. 113 No. 26, Jun. 28, 2016, pp. 7094-7099.

Geiger et al. "Crystal Chemistry and Stability of "Li7La3Zr2O12" garnet: A Fast Lithium-Ion Conductor". Inorg. Chem. 2011, 50, 1089-1097.

Gordon et al. "101, Preparation of Nano- and Microstructured Garnet Li7La3Zr2O12 Solid Electrolytes for Li-Ion Batteries via Cellulose Templating". ACS Sustainable Chem. Eng. 2016, 4, 6391-6398.

Guo et al. "Molten Salt Synthesis of Different Ionic Radii Metallic Compounds Doped Lithium Titanate Used in Li-Ion Batteiy Anodes". Mater. Trans. 2017, 58, 383-389.

Guo et al. "Molten Salt Synthesis of Nano-Sized Li4Ti5O12 Doped with Fe2O3 for Use as Anode Material in the Lithium-Ion Battery". RSC Adv. 2014, 4, 60327-60333.

Hamalainen et al., "Lithium Phosphate Thin Films Grown by Atomic Layer Deposition," J. Electrochem. Soc., 2012, 159(3):A259-A263, https://doi.org/10.1149/2.052203jes.

Hanc et al. "On Fabrication Procedures of Li-Ion Conducting Garnets," J. Solid State Chem. 2017, 248 (Nov. 2016), 51-60.

Huang et al. "Effect of Sintering Temperature on Structure and Ionic Conductivity of Li7—xLa3Zr2O12-0.5x (x = 0.5 ~ 0.7) Ceramics". Solid State Ionics 2011, 204,41-45.

Huang et al. "Growth of Well-Developed LaOCl Microplates by Chloride Salt-Assisted Method". CrystEngComm 2017, 19, 2971-2976.

(56) References Cited

OTHER PUBLICATIONS

Huang et al. "Preparation of CaZrO3 Powders by a Microwave—Assisted Molten Salt Method". J. Ceram. Soc. Jpn. 2016, 124, 593-596.

Ishiguro et al. "Ta-Doped Li7La3Zr2O12 for Water-Stable Lithium Electrode of Lithium-Air Batteries". J. Electrochem. Soc. 2014, 161, A668-A674.

Janani et al. "Synthesis of cubic Li7La3Zr2O12 by modified sol-gel process". Ionics (Kiel). 17, 575-580 (2011).

Jin et al. "Al-doped Li7La3Zr2O12 synthesized by a polymerized complex method" Journal of Power Sources 196, 2011, pp. 8683-8687.

Karakaya et al., "Assembly of Molten Transition Metal Salt-Surfactant in a Confined Space for the Synthesis of Mesoporous Metal Oxide-Rich Metal Oxide-Silica Thin Films," Chem. Mater., 2011, 23(12):3062-3071, https://doi.org/10.1021/cm200932k.

Kazyak et al., "Atomic Layer Deposition of the Solid Electrolyte Garnet Li7La3Zr2O12," Chem. Mater. 2017, 29(8):3785-3792, https://doi.org/10.1021/acs.chemmater.7b00944.

Keiteb et al., "A Modified Thermal Treatment Method for the Up-Scalable Synthesis of Size-Controlled Nanociystalline Titania," Appl. Sci., 2016, 6(295):1-10.

Kim et al. "Electrochemical Stability of Li6.5La3Zr1.5M0.5O12 (M = Nb or Ta) against Metallic Lithium, Front". Energy Res. 2016, 4,1-7.

Kim et al., "Atomic Layer Deposition of ZrO2 Thin Films with High Dielectric Constant on TiN Substrates," Electrochem, Solid-State Lett., 2008, 11(3):G9, https://doi.org/10.1149/1.2825763.

Knauth "Inorganic Solid Li Ion Conductors: An Overview". Solid State Ionics 2009, 180, 911-916.

Kokal "Solid State Electrolytes for All-Solid-State 3D Lithium-ion Batteries" Technische Universiteit Eindhoven, Jan. 1, 2012.

Kokal et al. "Sol-gel Synthesis and Lithium Ion Conductivity of Li7La3Zr2O12 with Garnet-Related Type Structure". Solid State Ionics 2011, 185,42-46.

Kozen et al. "Atomic Layer Deposition of the Solid Electrolyte LiPON," Chem. Mater., 2015, 27(15):5324-5331, https://doi.org/10.1021/acs.chemmater.5b01654.

Larraz et al. "Cubic Phases of Garnet-Type Li7La3Zr2O12: The Role of Hydration". J. Mater. Chem. A2013, 1, 11419.

Li et al., "Significant Impact on Cathode Performance of Lithium-Ion Batteries by Precisely Controlled Metal Oxide Nanocoatings via Atomic Layer Deposition," J. Power Sources, 2014, 247:57-69, https://doi.org/10.1016/j.jpowsour.2013.08.042.

Liu et al. "Garnet-type Li6.4La3Zr1.4Ta0.6O12 thin sheet: Fabrication and application in lithium-hydrogen peroxide semi-fuel cell" Electrochemistry Communications 48, 2014, pp. 147-150.

Liu et al. "High Lithium Ionic Conductivity in the Garnet-Type Oxide Li7₂—XLa3Zr2—XMoXO12 (X = 0-0.3) Ceramics by Sol-Gel Method". J. Am. Ceram. Soc. 2017, 100, 1527-1533.

Liu et al. "Salt Melt Synthesis of Ceramics, Semiconductors and Carbon Nanostructures," Chem. Soc. Rev., 2013, 42(21):8237, https://doi.org/10.1039/C3CS60159E.

Liu et al., "Atomic Layer Deposition of Lithium Tantalate Solid-State Electrolytes," J. Phys. Chem. C, 2013, 117(39):20260-20267, https://doi.org/10.1021/jp4063302.

Liu et al., "Toward 3D Solid-State Batteries via Atomic Layer Deposition Approach," Front. Energy Res., Mar. 2018, 6, 1-5. https://doi.org/10.3389/fenrg.2018.00010.

Liu et al., "Ultrathin Atomic Layer Deposited ZrO2 coating to Enhance the Electrochemical Performance of Li4Ti5O12 as an Anode Material," Electrochim Acta, 2013, 93:195-201, https://doi.org/10.1016/j.electacta.2012.12.141.

Loho et al., "Garnet-Type Li7La3Zr2O12 Solid Electrolyte Thin Films Grown by CO2-Laser Assisted CVD for All-Solid-State Batteries," J. Electrochem. Soc., 2017, 164(1):A6131-A6139 https://doi.org/10.1149/2.0201701jes.

Long et al., "Three-Dimensional Battery Architectures," Chem. Rev., 2004, 104:4463-4492, https://doi.org/10.1021/cr0207401.

Matsuda et al. "Phase Formation of a Garnet-Type Lithium-Ion Conductor Li7—3xAlxLa3Zr2O12". Solid State Ionics 2015, 277,23-29.

Miyashiro et al., "Improvement of Degradation at Elevated Temperature and at High State-of-Charge Storage by ZrO2 Coating on LiCoO2," J. Electrochem. Soc., 2006, 153(2):A348, https://doi.org/10.1149/1.2149306.

Murugan et al., "Fast Lithium Ion Conduction in Garnet-Type Li7La3Zr2O12". Angew. Chem., Int. Ed. 2007, 46, 7778-7781, https://doi.org/10.1002/anie.200701144.

Nisula et al., "Atomic Layer Deposition of Lithium Phosphorus Oxynitride," Chem. Mater., 2015, 27(20):6987-6993, https://doi.org/10.1021/acs.chemmater.5b02199.

Ohta et al. "High Lithium Ionic Conductivity in the Garnet-Type Oxide Li7 XLa3(Zr2 X,NbX)O12 (X = 0-2)". J. Power Sources 2011, 196, 3342-3345.

Pearse et al., "Three-Dimensional Solid-State Lithium-Ion Batteries Fabricated by Conformal Vapor-Phase Chemistiy," ACS Nano, 2018, 12:4286-4294, https://doi.org/10.1021/acsnano.7b08751.

Putkonen ct al., "Atomic Layer Deposition of Lithium Containing Thin Films," J. Mater. Chem., 2009, 19(46):8767, https://doi.org/10.1039/b913466b.

Putkonen et al., "ZrO2 Thin Films Grown on Silicon Substrates by Atomic Layer Deposition with Cp2Zr(CH3)2 and Water as Precursors," Chem. Vap. Depos., 2003, 9(4):207-212, https://doi.org/10.1002/cvde.200306254.

Rahman et al. "Basic Molten Salt Process—A New Route for Synthesis of Nanocrystalline Li4Ti5O12—TiO2 Anode Material for Li-Ion Batteries Using Eutectic Mixture of LiNO3—LiOH—Li2O2". J. Power Sources 2010, 195, 4297-4303.

Ramakumar et al. "Lithium Garnets: Synthesis, Structure, Li+ Conductivity, Li+ Dynamics and Applications". Prog. Mater. Sci. 2017, 88, 325-411.

Rangasamy et al. "The Role of Al and Li Concentration on the Formation of Cubic Garnet Solid Electrolyte of Nominal Composition Li7La3Zr2O12", Solid State Ionics 2012, 206, 28-32.

Reddy et al. "Molten salt synthesis and characterization of fast ion conductor Li6.75La3Zr1.75Ta0.25O12". J. Solid State Electrochem. (2017), 21, pp. 2921-2928.

Sakamoto et al. "Synthesis of Nano-Scale Fast Ion Conducting Cubic Li7La3Zr2O12". Nanotechnology 2013, 24, 42005, pp. 1-8.

Sharafi et al. "Impact of Air Exposure and Surface Chemistry on Li—Li7La3Zr2O12 Interfacial Resistance". J. Mater. Chem. A 2017, 5, 13475-13487.

Shimonishi et al. "Synthesis of Garnet-Type Li7 XLa3Zr2O12-1/2x and Its Stability in Aqueous Solutions". Solid State Ionics 2011, 183,48-53.

Smolenski et al., "A Potentiometric Study of the Interaction of Zr(IV) and O(II) Ions in the LiCl—KCl Eutectic Molten Salt," J. Electrochem. Soc., 2004, 151(9):E302, https://doi.org/10.1149/1.1779332.

Thangadurai et al. "Garnet-Type Solid-State Fast Li Ion Conductors for Li Batteries: Critical Review," Chem. Soc. Rev. 2014, 43:4714-4727, https://doi.org/10.1039/c4cs00020j.

Thompson et al. "Tetragonal vs. Cubic Phase Stability in Al-Free Ta Doped Li7La3Zr2O12 (LLZO)". J. Mater. Chem. A 2014, 2, 13431-13436.

Toda et al. "Low Temperature Cubic Garnet-Type CO2-Doped Li7La3Zr2O12". Solid State Ionics 2013, 233, 102-106.

Tsai et al. "High Conductivity of Mixed Phase Al-Substituted Li7La3Zr2O12". J. Electroceram. 2015, 35,25-32.

Van Hemmen et al., "Plasma and Thermal ALD of Al2O3 in a Commercial 200 Mm ALD Reactor," J. Electrochem. Soc., 2007, 154(7):165-169, https://doi.org/10.1149/1.2737629.

Wang et al. "Phase Transition in Lithium Garnet Oxide Ionic Conductors Li7La3Zr2O12: The Role of Ta Substitution and H2O/CO2 Exposure". J. Power Sources 2015, 275, 612-620.

Wang et al. "Preparation of Lanthanum Zirconate Nano-Powders by Molten Salts Method". J. Non-Cryst. Solids 2010, 356, 1049-1051.

Wang et al., "Atomic Layer Deposited Lithium Silicates as Solid-State Electrolytes for All-Solid-State Batteries," ACS Appl. Mater. Interfaces, 2017, 9(37):31786-31793, https://doi.org/10.1021/acsami.7b07113.

(56) References Cited

OTHER PUBLICATIONS

Wang et al., "Atomic Layer Deposition of Lithium Niobium Oxides as Potential Solid-State Electrolytes for Lithium-Ion Batteries," ACS Appl. Mater. Interfaces, 2018, 10(2):1654-1661, https://doi.org/10.1021/acsami.7b13467.

Weller et al. "Synthesis of Fine Cubic Li7La3Zr2O12 Powders in Molten LiCl—KCl Eutectic and Facile Densification by Reversal of Li+/H+ Exchange," ACS Appl. Energy Mater. 2018, 1, 552-560. Jan. 9, 2018.

Weller et al., U.S. Appl. No. 16/399,331, filed Apr. 30, 2019, 47 pages.

Whetten et al., "Li7La3Zr2O12 Nanoparticles Prepared Using Molten Salt Synthesis as Ceramic Fillers in Polymer Composite Solid Electrolytes," Presented at MRS Spring Meeting & Exhibit, 2018, Phoenix, AZ, 3 pages.

Wolfenstine et al. "Synthesis and High Li-Ion Conductivity of Ga-Stabilized Cubic Li7La3Zr2O12". Mater. Chem. Phys. 2012, 134, 571-575.

Xie et al. "Low-Temperature Synthesis of Li7La3Zr2O12 with Cubic Garnet-Type Structure". Mater. Res. Bull. 2012, 47, 1229-1232.

Yang et al. "Composite Polymer Electrolytes with Li7La3Zr2O12 Garnet-Type Nanowires as Ceramic Fillers: Mechanism of Conductivity Enhancement and Role of Doping and Morphology" ACS Appl. Mater. Interfaces 2017, 9, 21773-21780, and the Supporting Information, p. S1-S15 (Year: 2017).

Yang et al. "Nanostructured Garnet-Type Solid Electrolytes for Lithium Batteries: Electrospinning Synthesis of Li7La3Zr2O12 Nanowires and Particle Size-Dependent Phase Transformation". J. Phys. Chem. C, 2015, 119(27):14947-14953.

Yi et al. "Flame Made Nanoparticles Permit Processing of Dense, Flexible, Li+ Conducting Ceramic Electrolyte Thin Films of Cubic-Li7La3Zr2O12 (c-LLZO)", J. Mater. Chem. A 2016, 4, 12947-12954.

Yi et al. "Key Parameters Governing the Densification of Cubic-Li7La3Zr2O12 Li+ Conductors". J. Power Sources 2017, 352, 156-164.

Zhang "Low Temperature Synthesis of Complex Refractory Oxide Powders From Molten Salts". J. Pakistan Mater. Soc. 2007, 1,49-53.

Zhong et al. "Layered lithium-rich oxide nanoparticles: low-temperature synthesis in mixed molten salt and excellent performance as cathode of lithium-ion battery". Ionics (Kiel). (2017), 23, pp. 1955-1966.

\* cited by examiner

LITHIUM LANTHANUM ZIRCONATE THIN FILMS

CROSS-REFERENCE TO RELATED APPLICATIONS

This application is a divisional of U.S. application Ser. No. 16/669,767, now U.S. Pat. No. 11,268,196, entitled "LITHIUM LANTHANUM ZIRCONATE THIN FILMS" and filed on Oct. 31, 2019, which claims the benefit of U.S. application Ser. No. 62/753,503 entitled "LITHIUM LANTHANUM ZIRCONATE THIN FILMS" and filed on Oct. 31, 2018, which are incorporated herein by reference in their entirety.

STATEMENT OF GOVERNMENT INTEREST

This invention was made with government support under 1553519 awarded by the National Science Foundation. The government has certain rights in the invention.

TECHNICAL FIELD

This invention relates to methods of fabricating conformal lithium lanthanum zirconate (LLZO) thin films and the resulting films.

BACKGROUND

To realize the next generation of all-solid-state lithium batteries with three-dimensional (3D) architectures for high energy and power capability, new methods for the deposition of solid state electrolytes (SSEs) are needed. Atomic layer deposition (ALD) can be used to deposit thin films onto 3D substrates. However, the development of SSEs with high Li$^+$ ionic conductivity using ALD is challenging due to the limited suitable precursors available and the complex, multi-element compositions of the materials.

SUMMARY

As described herein, lithium lanthanum zirconate ($Li_7La_3Zr_2O_{12}$ or LLZO) thin films can be synthesized in a molten salt medium from atomic-layer deposition (ALD) $ZrO_2$ thin films serving as a conformal seed layer. This molten-salt mediated deposition of LLZO is effective for forming conformal thin films on 3D substrates with high aspect ratios (e.g., greater than 50, greater than 100, and less than 200, or less than 150). The formed LLZO is highly crystalline (cubic phase), and has an ionic conductivity ~$10^{-4}$-$10^{-3}$ S/cm, and a controlled thickness from ~100 nm to 10 µm. This facilitates the fabrication of 3D electrodes for Li batteries with enhanced volumetric energy density and power. The synthesis take less reaction time than ALD methods for depositing the LLZO material, and can yield materials with better crystallinity and ionic conductivity compared to ALD, CVD, and sputtering methods.

In a first general aspect, coating a substrate includes disposing zirconium oxide on a substrate to yield a zirconium oxide coating on the substrate, contacting the zirconium oxide coating with a solution including a lithium salt and a lanthanum salt with, heating the substrate to yield a dried salt coating on the zirconium oxide coating, melting the dried salt coating to yield a molten salt mixture, reacting the molten salt mixture with the zirconium oxide coating to yield lithium lanthanum zirconate, and cooling the lithium lanthanum zirconate to yield a lithium lanthanum zirconate coating on the substrate.

In a second general aspect, coating a substrate includes disposing zirconium oxide on a substrate to yield a zirconium oxide coating on the substrate, heating an aqueous mixture comprising a lithium salt and a lanthanum salt to yield a molten salt mixture, contacting the zirconium oxide coating with the molten salt mixture, reacting the molten salt mixture with the zirconium oxide coating to yield lithium lanthanum zirconate, and cooling the lithium lanthanum zirconate to yield a lithium lanthanum zirconate coating on the substrate.

Implementations of the first and second general aspects may include one or more of the following features.

Disposing zirconium oxide on the substrate may include atomic layer deposition or plasma-enhanced atomic layer deposition of zirconium oxide on the substrate. In some cases, the substrate is planar. In certain cases, the substrate includes protrusions and recessions. Disposing the zirconium oxide on the substrate may further include disposing additional zirconium oxide on the zirconium oxide coating with a chemical vapor deposition or sol-gel process. The zirconium oxide used to form the zirconium oxide coating may be in the form of zirconium oxide nanoparticles. In some cases, the zirconium oxide coating is amorphous.

Contacting the zirconium oxide coating with the solution may include spraying the solution on the zirconium oxide coating or drop casting the solution on the zirconium oxide coating. The lithium salt may include lithium nitrate, the lanthanum salt may include lanthanum nitrate, or both. The solution may be homogeneous. In certain cases, the solution includes a polar solvent (e.g., water or an organic solvent such as methanol). The solution may further include a zirconium salt (e.g., a nitrate salt). Contacting the zirconium oxide coating with the molten salt mixture may include immersing the substrate in the molten salt mixture. The aqueous solution may include a zirconium salt.

Heating the substrate may include removing liquid from the solution. Melting the dried salt coating may include heating the substrate to at least 400° C., at least 450° C., at least 800° C. or at least 900° C. Contacting the solution with the zirconium oxide coating may include wetting the zirconium oxide coating with the solution.

The lithium lanthanum zirconate coating may be polycrystalline or nanocrystalline. A thickness of the lithium lanthanum zirconate coating is typically in a range of 1 micron to 10 microns.

The details of one or more embodiments of the subject matter of this disclosure are set forth in the accompanying drawings and the description. Other features, aspects, and advantages of the subject matter will become apparent from the description, the drawings, and the claims.

DETAILED DESCRIPTION

Figure 1A:
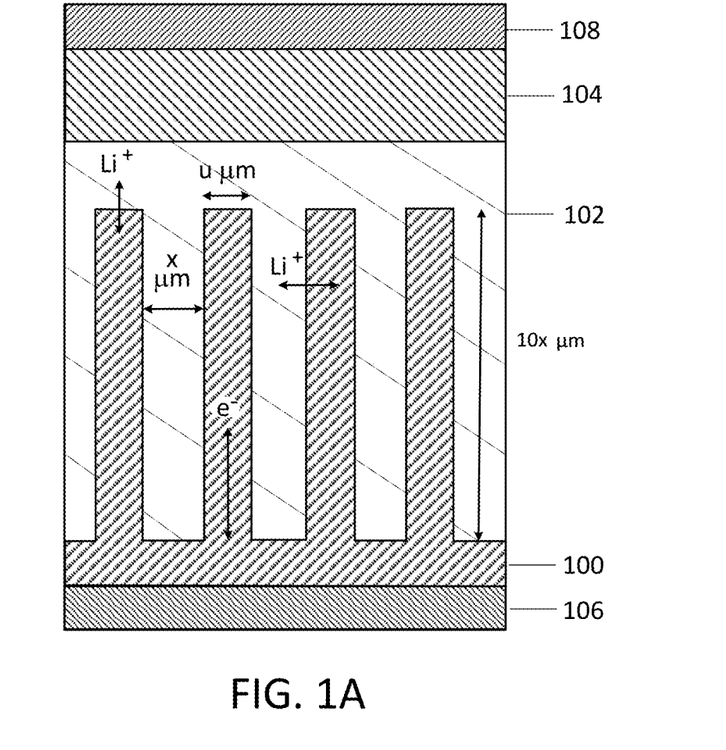
FIG. 1A depicts a portion of a solid-state battery with a three-dimensional (3D) cathode and a planar anode.
Figure 1B:
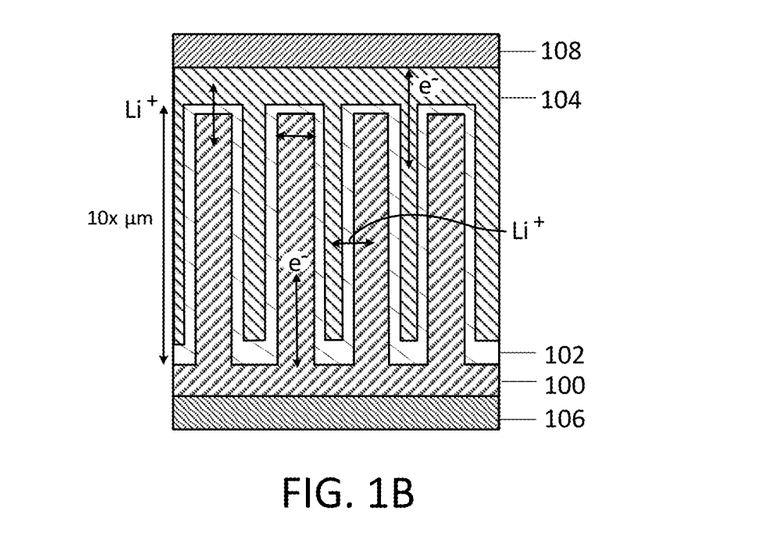
FIG. 1B depicts a portion of a solid-state battery with 3D interdigitated electrodes.

Three-dimensional (3D) battery electrodes that utilize solid-state electrolytes (SSEs) have attracted much interest because of their potential for improved energy and power densities and safety characteristics. Two example 3D battery architectures are shown in FIGS. 1A and 1B. In FIG. 1A, 3D structured cathode 100 (either a plate or pillar array) is infiltrated with SSE 102 and paired with planar anode 104. Cathode 100 and anode 104 contact current collectors 106 and 108, respectively. In FIG. 1B, a conformal SSE 102 deposited on 3D cathode 100 enables infiltration with a 3D anode 104 to form interdigitated plates (or pillars). In both cases, high aspect ratios of 100 (e.g. where x is the plate (or pillar) thickness, the plate (or pillar) height is 10×, and x=10-20 μm) are typically required for the desired energy and power enhancements over planar batteries. A desired thickness of the SSE can be in a range of about 1-10 μm.

To realize both types of structures, a method to conformally deposit SSEs into high aspect ratio structures is described. For thin films of SSE, the electrolyte resistance (R) is determined by $R=l(\sigma A)^{-1}$, where l is the thickness and σ is the Li$^+$ ionic conductivity. For a SSE with σ~$10^{-7}$ S/cm, a thin film is typically no more than 1 μm in thickness to have comparable electrolyte resistance to the best bulk SSEs ~1 mm thick with σ~$10^{-4}$ S/cm. Chemical vapor deposition (CVD) methods can provide thin films with better conformality than physical deposition methods (e.g., pulsed laser deposition or sputtering) but are limited for high aspect ratio designs. Atomic layer deposition (ALD) allows deposition of pinhole-free films on substrates with high aspect ratios on account of the self-limiting nature of the surface reactions in ALD.

In some cases, ALD methods are limited to depositing thin films only on the order of a few hundred nanometers. For at least this reason, ALD thin films are typically not well suited for depositing SSEs in 3D architectures like the one illustrated in FIG. 1A, where channels (voids) separating the electrode plates/pillars that need to be filled are ~10 μm.

The development of ALD methods for battery materials for high energy and high power applications has many technical obstacles. In general, it is challenging to develop ALD processes for Li-containing materials due to the limited options for suitable volatile Li precursors. Garnet-type $Li_7La_3Zr_2O_{12}$ (LLZO) has high ionic conductivity and chemical stability against both air and metallic lithium. Due at least in part to the complex composition and structure, it can be a challenge to obtain high quality LLZO using vapor deposition processes, with ALD of LLZO typically requiring multiple sub-cycles of each constituent element as its binary oxide. LLZO is conventionally prepared using a solid-state reaction from LiOH or $Li_2CO_3$, $La_2O_3$, and $ZrO_2$, along with oxides of dopants (e.g., $Al_2O_3$) as reagents at high temperatures (>1100° C.) and long sintering times (24+ hours) to obtain the desired crystal structure and ionic conductivity. The cubic phase of LLZO generally displays Li-ion conductivity on the order of 0.1-1 mS/cm, depending on the extrinsic dopant used to stabilize the metastable cubic phase at room temperature. In the absence of dopants, the tetragonal phase is obtained, which has 3-4 orders of magnitude lower ionic conductivity.

Figure 2:
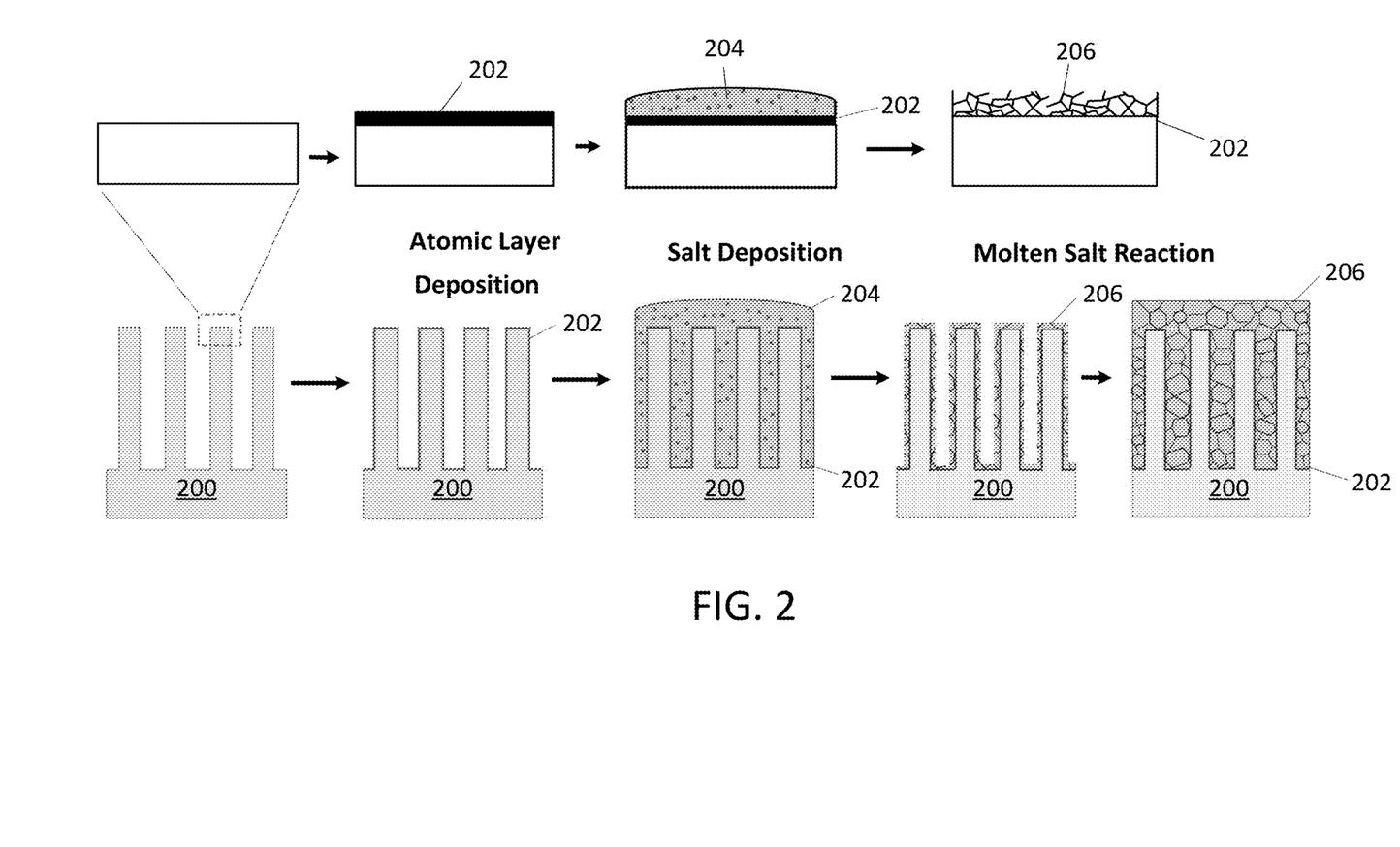
FIG. 2 depicts a process for fabricating a conformal lithium lanthanum zirconate (LLZO) thin film on a 3D substrate.

Referring to FIG. 2, the process described herein combines the conformal nature of ALD with a synthetic method that enables the formation of high quality, crystalline LLZO. As depicted in FIG. 2, substrate electrode 200 is coated with a layer of $ZrO_2$ 202 deposited by ALD. In some cases, plasma-enhanced ALD (PEALD), which can yield films with good conformality and high density and purity, may be used to deposit the $ZrO_2$ coating. The $ZrO_2$ coating is typically conformal, in that it conforms to the contours of the substrate to which it is applied. The $ZrO_2$ coating is believed to be an effective interphase or buffer layer to prevent undesired side reactions at the interface between the electrode active material and the solid-electrolyte. A suitable deposition temperature may be as low as 100° C., advantageously preventing damage or side reactions with the substrate.

In some cases, additional $ZrO_2$ can be deposited on top of the pinhole free ALD $ZrO_2$ layer. This can be accomplished by using chemical vapor deposition (CVD), sol-gel chemistry, or adding additional Zr reagent in the MSS (e.g., zirconium oxynitrate). If the $ZrO_2$ layer exceeds a certain thickness, some unreacted $ZrO_2$ may remain at the interface between the substrate and the LLZO. This remaining $ZrO_2$ may provide a good surface passivation layer for battery materials, serve as a buffer layer, or both.

Figure 3:
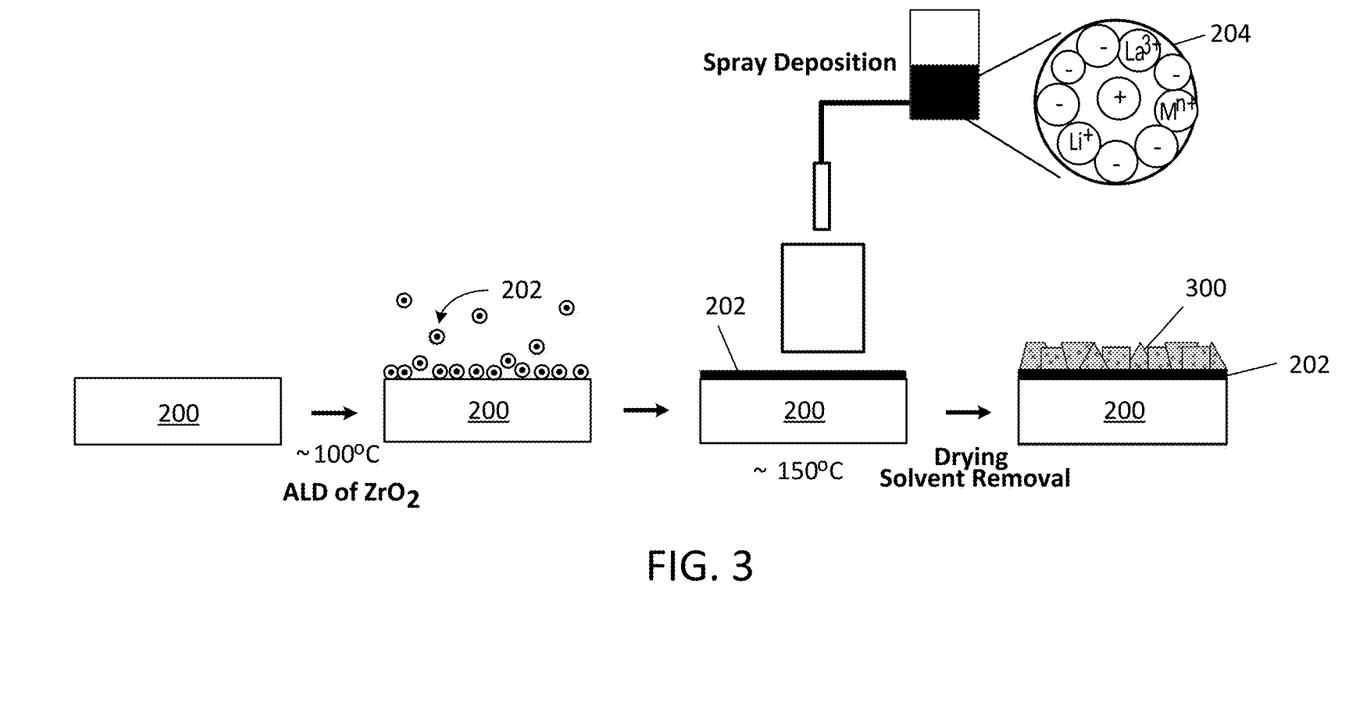
FIG. 3 depicts deposition of a thin film of $ZrO_2$ onto a substrate using atomic layer deposition (ALD), followed by spray deposition of a salt mixture onto the substrate coated by ALD.

The $ZrO_2$ coating also serves as a seed layer for the formation of LLZO using a topochemical, molten salt synthesis (MSS) mediated conversion process, allowing the formation of a thin film of crystalline LLZO with high ionic conductivity on the substrate. Once the $ZrO_2$ layer is deposited, solution 204 containing LLZO precursor salts and MSS salts is applied to the surface, for example using spray deposition, as depicted in FIG. 3. In this approach, a solution including a lithium salt (e.g., lithium nitrate) and a lanthanum salt (e.g., lanthanum nitrate) is first dissolved in water and homogenously mixed. In some cases, the solution includes a zirconium salt (e.g., zirconium oxynitrate). One or more dopants (e.g., Al, Ga, Ta) may be incorporated in the molten salt as salt or oxidic precursors. The molten salt synthesis salts may include eutectic mixtures of halide, carbonate, nitrate, peroxide, or hydroxide salts, or any combination thereof, which become liquid at temperatures exceeding the eutectic temperature ($T_e$) of the mixture. The solution 204 is then sprayed onto a substrate, and this substrate is placed in an oven or heated on a hot plate, in order to volatilize the solvent and leave the dried salts 300 deposited as a thin film on the substrate 200. Alternatively, an ultrasonic nebulizer can also be used to atomize the solution and deposit fine droplets <5 μm in size. Further film growth in the salt melt can result in thicknesses on the order of several microns. Thus, as depicted in FIG. 2, LLZO layer 206 can be formed within a 3D electrode architecture.

In some cases, due at least in part to the "shadow effect," spray deposition may not be effective for depositing the salt reactants onto 3D substrates with extremely high aspect ratios. However, for a 3D electrode architecture as depicted in FIG. 2, it is expected that a solution containing the salt precursors can be dried within the voids by drop casting and drying. In certain cases, the entire electrode can also be immersed in the molten salt solution.

Figure 4A:
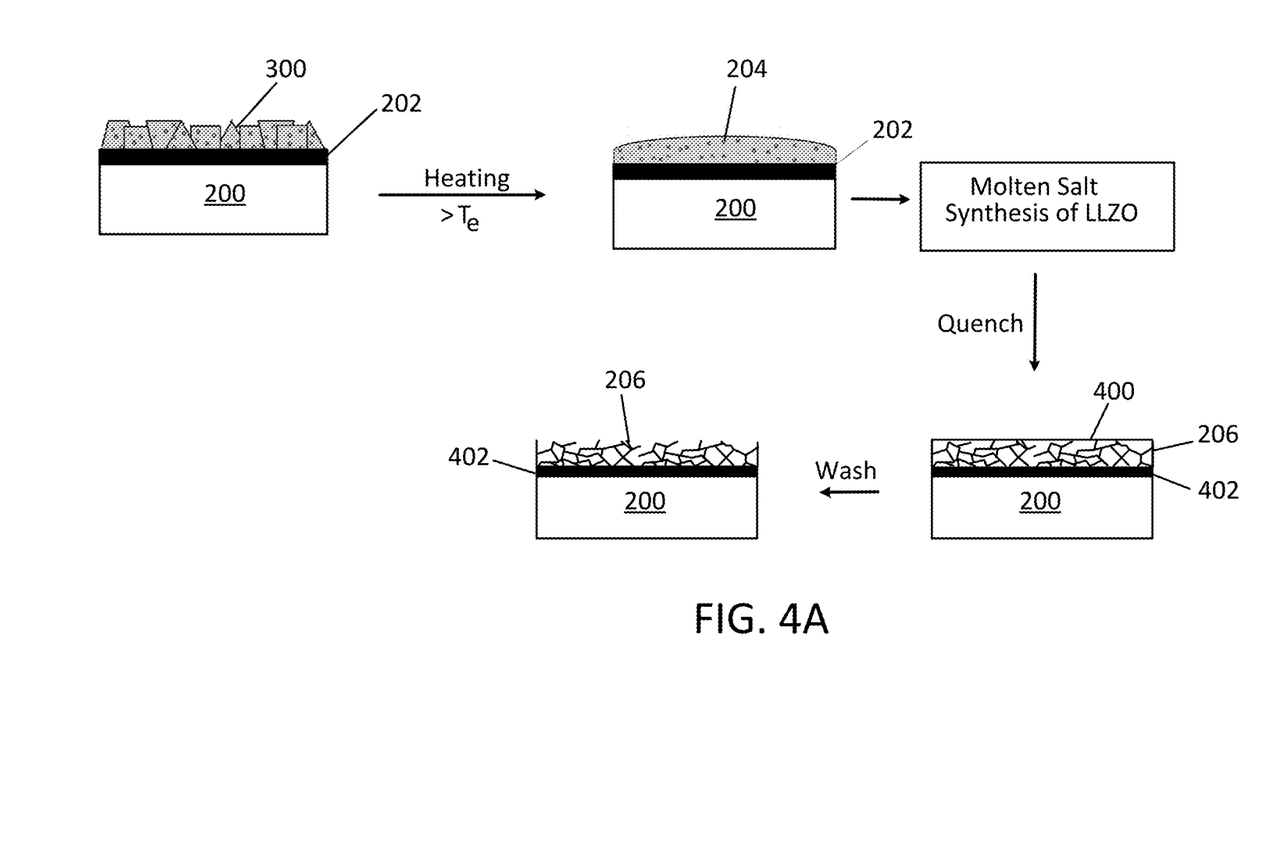
FIG. 4A depicts molten salt synthesis (MSS) mediated formation of LLZO on a $ZrO_2$ thin film.

As depicted in FIG. 4A, the thin film salt mixture is dried to yield dried salts 300, and the substrate 200 is then heated above the eutectic temperature of the MSS medium in order to melt the salts, redissolve the LLZO precursor salts, and enable the $ZrO_2$ to react within the medium to form LLZO 206. In some cases, the salts form a liquid film on the $ZrO_2$ that allows the reactants to diffuse down into the film. It is expected that $La_2Zr_2O_7$ (LZO), in the form of a nanocrystalline film, will present as the intermediate phase and eventually transform to a polycrystalline LLZO film upon further reaction with Li and La precursor salts. This LZO to LLZO transformation is believed to be topochemical in nature. When the LLZO reaction has completed and the substrate is cooled below the eutectic temperature, the salt medium solidifies. Cooled salt medium 400 is removed by washing (e.g., with methanol) to avoid significant $Li^+/H^+$ exchange on the surface of the LLZO, which can decrease the ionic conductivity.

Figure 4B:
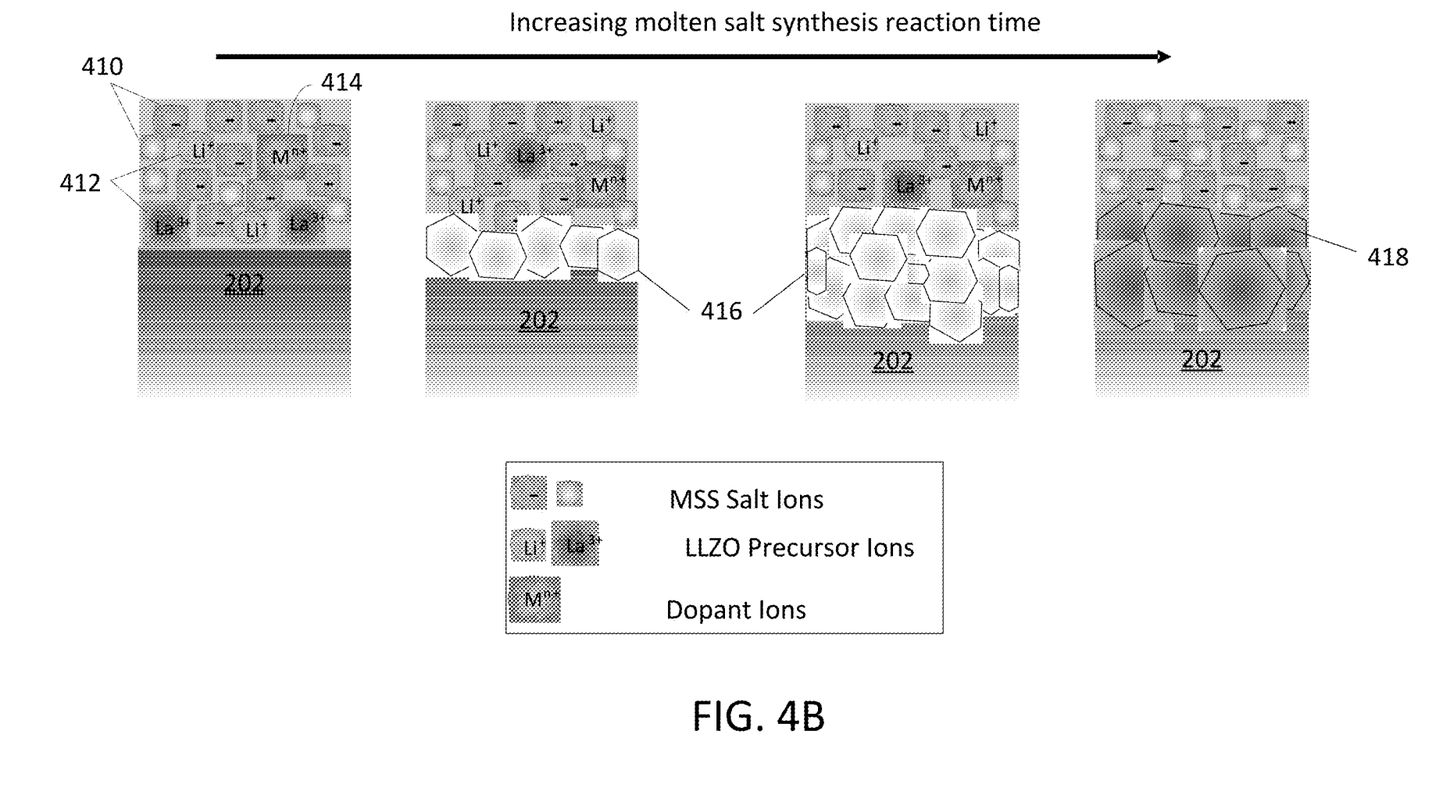
FIG. 4B depicts a mechanism for the formation of LLZO thin films on a $ZrO_2$ thin film using a MSS mediated reaction.

FIG. 4B depicts a mechanism for MSS mediated formation of LLZO. As depicted in FIG. 4B, dried salt layer 300 is disposed on $ZrO_2$ layer 202. Dried salt layer 300 includes MSS salt ions 410, LLZO precursor ions 412 ($Li^+$, $La^{3+}$), and dopant ions 414 ($M^{n+}$). As the MSS reaction proceeds, an LZO layer 416 is formed, and is transformed into M-doped LLZO layer 418.

Upon heating, the liquid layer is expected to achieve appropriate wetting of the surface of the $ZrO_2$, so that it does not form discrete portions, thereby resulting in a discontinuous LLZO film, or fully spread, thereby enhancing volatilization of the salt medium or prevent sufficient volume of liquid for the reaction. The immersion of the $ZrO_2$-coated substrates directly into the molten salt melt (i.e., in a crucible), may provide desired results, with the salt melt containing the Li and La salt precursors and the Zr provided by the ALD layer. Assuming that LLZO will only form on the surface of the $ZrO_2$, this approach is expected to result in a thin film of LLZO. This immersion approach may also be more amenable for the formation of LLZO on 3D substrates, as the liquid salt mixture easily penetrates the pores. Once the seed layer of LLZO (nucleated from the ALD $ZrO_2$) is formed, then additional LLZO can be grown to form thicker films via MSS using Li, La, Zr, and dopant reactants.

Methods described herein have several advantages that can address the aforementioned challenges of ALD processes for SSE materials. Performing ALD of a binary oxide ($ZrO_2$) simplifies the deposition process and eliminates the need for using sub-cycles in order to obtain films with the desired composition. Moreover, the ALD layer of $ZrO_2$ does not have to be crystalline to serve as a seed layer, enabling lower temperature ALD deposition. This could mitigate the interdiffusion of cations at the interface between the $ZrO_2$ and electrode active material, which can be detrimental to surface properties of the electrode and can cause high interfacial impedance during electrochemical cycling. LLZO prepared by MSS is crystalline and has comparable ionic conductivity (~$10^{-4}$ S/cm) to materials prepared by solid-state reaction. The molten salt medium can also be used to increase the thickness of the initial LLZO thin film nucleated from the ALD $ZrO_2$ thin film.

Figure 5A:
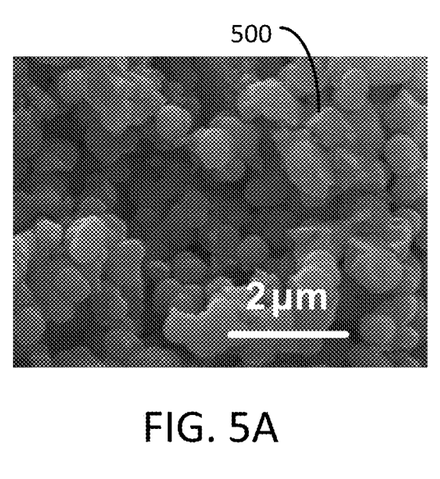
FIGS. 5A and 5B show SEM images of $ZrO_2$ nanoparticles and a product obtained by MSS at 800° C., respectively.
Figure 5B:
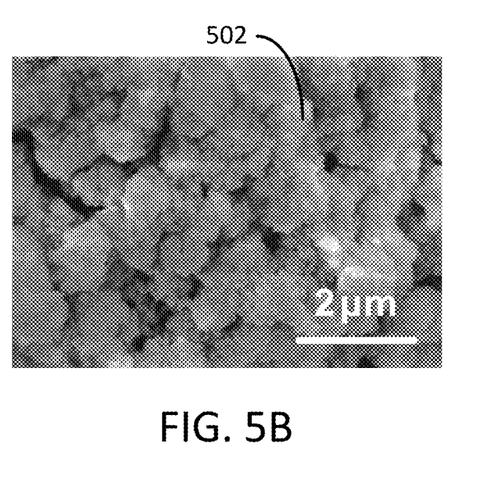
Figure 5C:
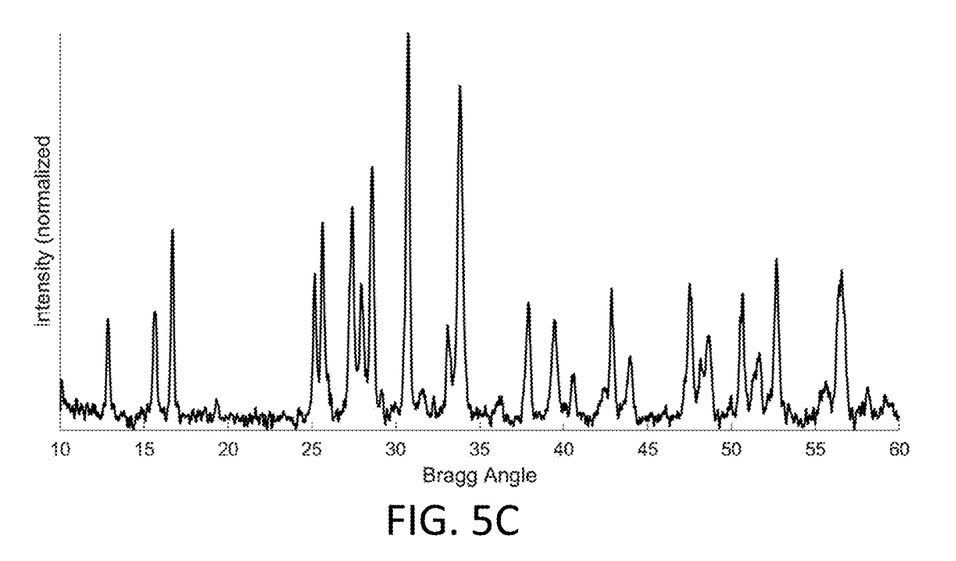
FIG. 5C shows an X-ray diffraction (XRD) spectrum of LLZO formed by MSS.

$ZrO_2$ nanoparticles (zirconium source for the preparation of LLZO using the MSS reaction) were prepared using a sol-gel precipitation reaction from zirconium butoxide. FIG. 5A is a scanning electron microscope (SEM) image of the resulting $ZrO_2$ nanoparticles 500. FIGS. 5B and 5C show a SEM image an X-ray diffraction (XRD) pattern, respectively, of the LLZO product 502 obtained after MSS reaction at 800° C. in a LiCl/KCl eutectic mixture. The XRD pattern shows that the primary phase of the product is cubic LLZO, with secondary products present due to unoptimized reaction conditions.

Thus, LLZO formation was observed at 800° C., 100 degrees lower than when using $Zr(NO_3)_2$ as the precursor, consistent with the decreased formation temperature on account of heterogenous nucleation of LLZO on the $ZrO_2$. It is believed that LLZO formation may occur at temperatures as low as 400° C., or as low as 450° C. The transformation of the $ZrO_2$ to LLZO is believed to be topochemical in nature, as the nanoparticle morphology was preserved in the LLZO product. This result, together with the low solubility of $ZrO_2$ in the LiCl/KCl eutectic, suggests that the formation of LLZO is not a dissolution-precipitation reaction, but rather a transformation of the $ZrO_2$ into LLZO upon reaction with the LLZO precursors in this reactive salt medium. As such, the formation of LLZO is possible from amorphous $ZrO_2$ nanoparticles. Similarly, it is believed that the formation of LLZO is also possible from $ZrO_2$ thin films.

U.S. Patent Publication No. 2019/0062176, which is incorporated herein by reference, describes the synthesis of LLZO using a molten salt reaction. U.S. patent application Ser. No. 16/399,331, which is incorporated herein by reference, describes the synthesis of LLZO thin films by mixing Li and La salts with lanthanum zirconate nanocrystals to form a slurry, followed by tape casting and sintering to form thin films.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A method of coating a substrate, the method comprising:
    disposing zirconium oxide on a substrate to yield a zirconium oxide coating on the substrate;
    heating an aqueous mixture comprising a lithium salt and a lanthanum salt to yield a molten salt mixture;
    contacting the zirconium oxide coating with the molten salt mixture;
    reacting the molten salt mixture with the zirconium oxide coating to yield lithium lanthanum zirconate; and cooling the lithium lanthanum zirconate to yield a lithium lanthanum zirconate coating on the substrate.

2. The method of claim 1, wherein contacting the substrate with the molten salt mixture comprises immersing the substrate in the molten salt mixture.

3. The method of claim 1, wherein the aqueous mixture further comprises a zirconium salt.

4. The method of claim 1, wherein disposing zirconium oxide on the substrate comprises atomic layer deposition or plasma-enhanced atomic layer deposition of zirconium oxide on the substrate.

5. The method of claim 4, wherein disposing the zirconium oxide on the substrate further comprises disposing additional zirconium oxide on the zirconium oxide coating with a chemical vapor deposition or sol-gel process.

6. The method of claim 1, wherein disposing the zirconium oxide on the substrate comprises disposing zirconium oxide nanoparticles on the substrate.

7. The method of claim 6, further comprising preparing the zirconium oxide nanoparticles by a sol-gel precipitation reaction comprising zirconium butoxide.

8. The method of claim 1, wherein the zirconium oxide coating is amorphous.

9. The method of claim 1, wherein the aqueous mixture is homogeneous.

10. The method of claim 1, wherein the lithium salt comprises lithium nitrate.

11. The method of claim 1, wherein the lanthanum salt comprises lanthanum nitrate.

12. The method of claim 1, wherein the aqueous mixture further comprises a zirconium salt.

13. The method of claim 12, wherein the zirconium salt comprises a nitrate salt.

14. The method of claim 1, wherein the molten salt mixture comprises one or more metal dopants.

15. The method of claim 14, wherein the metal dopants comprise salt precursors, oxidic precursors, or any combination thereof.

16. The method of claim 14, wherein the metal dopants comprise aluminum, gallium, tantalum, or any combination thereof.

17. The method of claim 1, wherein the molten salt mixture comprises halide, carbonate, nitrate, peroxide, or hydroxide salts, or any combination thereof.

18. The method of claim 1, wherein reacting the molten salt mixture with the zirconium oxide coating to yield the lithium lanthanum zirconate occurs at a temperature in a range of 400° C. to 800° C.

* * * * *